United States Patent
Tsai et al.

(10) Patent No.: US 9,543,438 B2
(45) Date of Patent: Jan. 10, 2017

(54) CONTACT RESISTANCE REDUCTION TECHNIQUE

(71) Applicant: Taiwan Semiconductor Manufacturing Company, Ltd., Hsin-Chu (TW)

(72) Inventors: Chun Hsiung Tsai, Xinpu Township (TW); Ming-Te Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/515,311

(22) Filed: Oct. 15, 2014

(65) Prior Publication Data

US 2016/0111537 A1   Apr. 21, 2016

(51) Int. Cl.
| | |
|---|---|
| *H01L 21/8234* | (2006.01) |
| *H01L 29/78* | (2006.01) |
| *H01L 21/265* | (2006.01) |
| *H01L 29/165* | (2006.01) |
| *H01L 29/66* | (2006.01) |
| *H01L 29/08* | (2006.01) |
| *H01L 29/45* | (2006.01) |
| *H01L 21/02* | (2006.01) |
| *H01L 21/324* | (2006.01) |
| *H01L 21/285* | (2006.01) |
| *H01L 29/167* | (2006.01) |
| *H01L 21/8238* | (2006.01) |

(52) U.S. Cl.
CPC ..... *H01L 29/7848* (2013.01); *H01L 21/26506* (2013.01); *H01L 21/26513* (2013.01); *H01L 21/28518* (2013.01); *H01L 21/324* (2013.01); *H01L 21/823418* (2013.01); *H01L 21/823431* (2013.01); *H01L 21/823814* (2013.01); *H01L 21/823821* (2013.01); *H01L 29/0847* (2013.01); *H01L 29/165* (2013.01); *H01L 29/167* (2013.01); *H01L 29/45* (2013.01); *H01L 29/665* (2013.01); *H01L 29/6681* (2013.01); *H01L 29/7851* (2013.01); *H01L 21/0262* (2013.01); *H01L 21/02532* (2013.01)

(58) Field of Classification Search
CPC ................ H01L 29/7848; H01L 2029/7858; H01L 21/0245
USPC .................................................. 438/283, 478
See application file for complete search history.

(56) References Cited

U.S. PATENT DOCUMENTS

| | | | | |
|---|---|---|---|---|
| 2005/0145941 | A1* | 7/2005 | Bedell | H01L 21/845 257/348 |
| 2006/0071275 | A1* | 4/2006 | Brask | H01L 21/845 257/350 |

(Continued)

*Primary Examiner* — Moazzam Hossain
(74) *Attorney, Agent, or Firm* — Slater Matsil, LLP

(57) ABSTRACT

An embodiment is a method of manufacturing a semiconductor device, the method including forming a first gate over a substrate, forming a recess in the substrate adjacent the first gate, epitaxially forming a strained material stack in the recess, the strained material stack comprising at least three layers, each of the at least three layers comprising a dopant. The method further includes co-implanting the strained material stack with dopants comprising boron, germanium, indium, tin, or a combination thereof, forming a metal layer on the strained material stack, and annealing the metal layer and the strained material stack forming a metal-silicide layer.

20 Claims, 14 Drawing Sheets

(56) References Cited

U.S. PATENT DOCUMENTS

| | | | | |
|---|---|---|---|---|
| 2006/0166456 A1* | 7/2006 | Fujiwara | H01L 29/41733 | 438/399 |
| 2010/0035400 A1* | 2/2010 | Zhu | H01L 21/28061 | 438/300 |
| 2010/0052059 A1* | 3/2010 | Lee | H01L 29/6659 | 257/368 |
| 2010/0155846 A1* | 6/2010 | Mukherjee | H01L 21/28512 | 257/365 |
| 2010/0301350 A1* | 12/2010 | Tamura | H01L 21/823807 | 257/77 |
| 2011/0068396 A1* | 3/2011 | Cheng | H01L 29/165 | 257/335 |
| 2011/0133292 A1* | 6/2011 | Lee | H01L 21/823431 | 257/401 |
| 2011/0147812 A1* | 6/2011 | Steigerwald | H01L 21/28123 | 257/288 |
| 2011/0147828 A1* | 6/2011 | Murthy | H01L 21/02057 | 257/327 |
| 2012/0319211 A1* | 12/2012 | van Dal | H01L 29/66795 | 257/401 |
| 2013/0069172 A1* | 3/2013 | Liao | H01L 29/41783 | 257/408 |
| 2013/0187228 A1* | 7/2013 | Xie | H01L 29/785 | 257/347 |
| 2013/0285141 A1* | 10/2013 | Kuo | H01L 29/66545 | 257/347 |
| 2014/0001520 A1* | 1/2014 | Glass | H01L 29/66439 | 257/288 |
| 2014/0035000 A1* | 2/2014 | Ontalus | H01L 29/665 | 257/192 |
| 2014/0042500 A1 | 2/2014 | Wann et al. | | |
| 2014/0087547 A1* | 3/2014 | Miyano | H05B 6/806 | 438/486 |
| 2014/0094023 A1* | 4/2014 | Lee | H01L 21/28518 | 438/486 |
| 2014/0203370 A1* | 7/2014 | Maeda | H01L 29/785 | 257/365 |
| 2014/0217517 A1* | 8/2014 | Cai | H01L 27/0886 | 257/401 |
| 2014/0252469 A1 | 9/2014 | Lee et al. | | |
| 2015/0380489 A1* | 12/2015 | Chan | H01L 27/0886 | 257/192 |

* cited by examiner

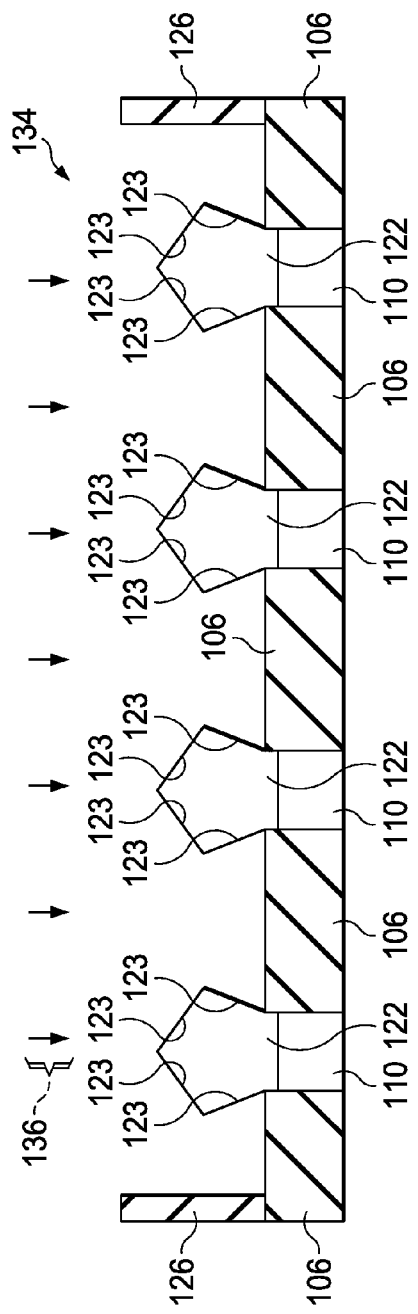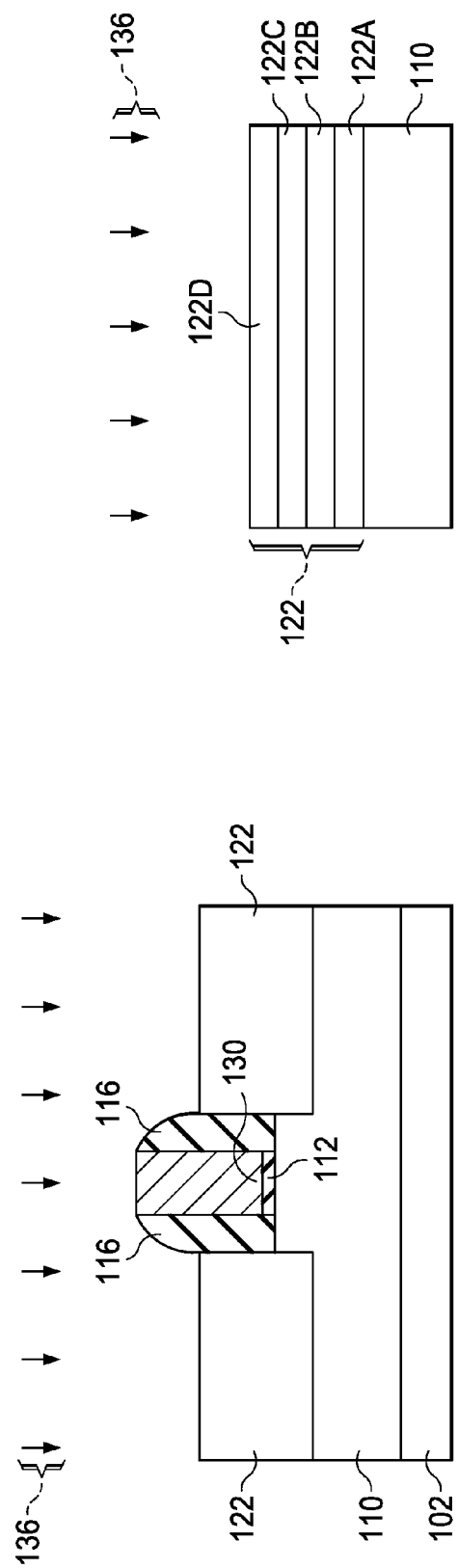

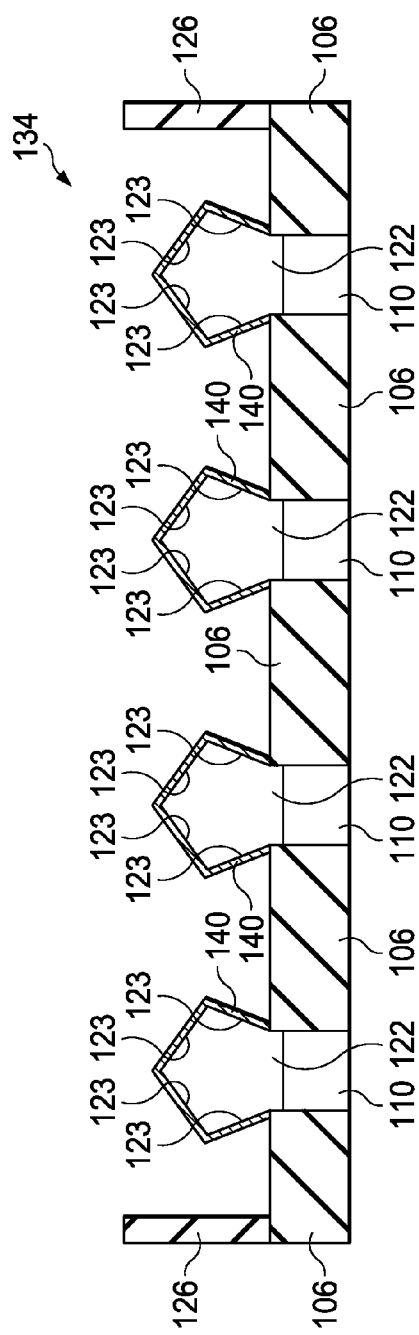
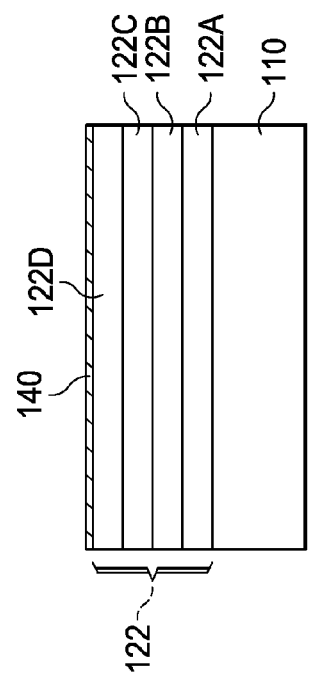
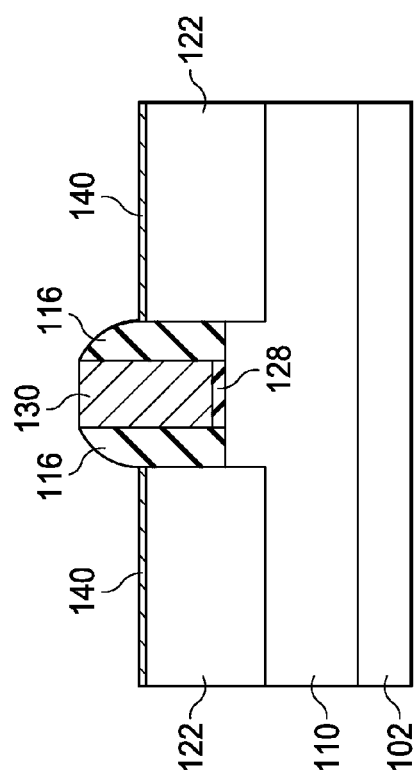
FIG. 10a
FIG. 10c
FIG. 10b

CONTACT RESISTANCE REDUCTION TECHNIQUE

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

Semiconductor integrated circuit microelectronic fabrications are formed from semiconductor substrates within and upon which are formed semiconductor devices, and over which are formed patterned conductor layers separated by dielectric layers. Ubiquitous within the fabrication of semiconductor integrated circuit microelectronic fabrications is the use of field effect transistor (FET) devices as switching devices within both logic semiconductor integrated circuit microelectronic fabrications and memory semiconductor integrated circuit microelectronic fabrications. Field effect transistor (FET) devices are ubiquitous within the art of semiconductor integrated circuit microelectronic fabrication for use as switching devices within logic and memory semiconductor integrated circuit microelectronic fabrications. Field effect transistor (FET) devices, in addition to being generally readily fabricated within semiconductor integrated circuit microelectronic fabrications, are also generally readily scalable within semiconductor integrated circuit microelectronic fabrications.

While field effect transistor (FET) devices are thus clearly desirable and essential in the art of semiconductor integrated circuit microelectronic fabrication, the fabrication of field effect transistor (FET) devices with enhanced performance is challenging to achieve while simultaneously decreasing the dimensions. It is within this context the following disclosure arises.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1 through 12 are cross-sectional and perspective views of intermediate stages in the manufacturing of a Fin Field-Effect Transistor (FinFET) in accordance with some embodiments.

DETAILED DESCRIPTION

Figure 1:
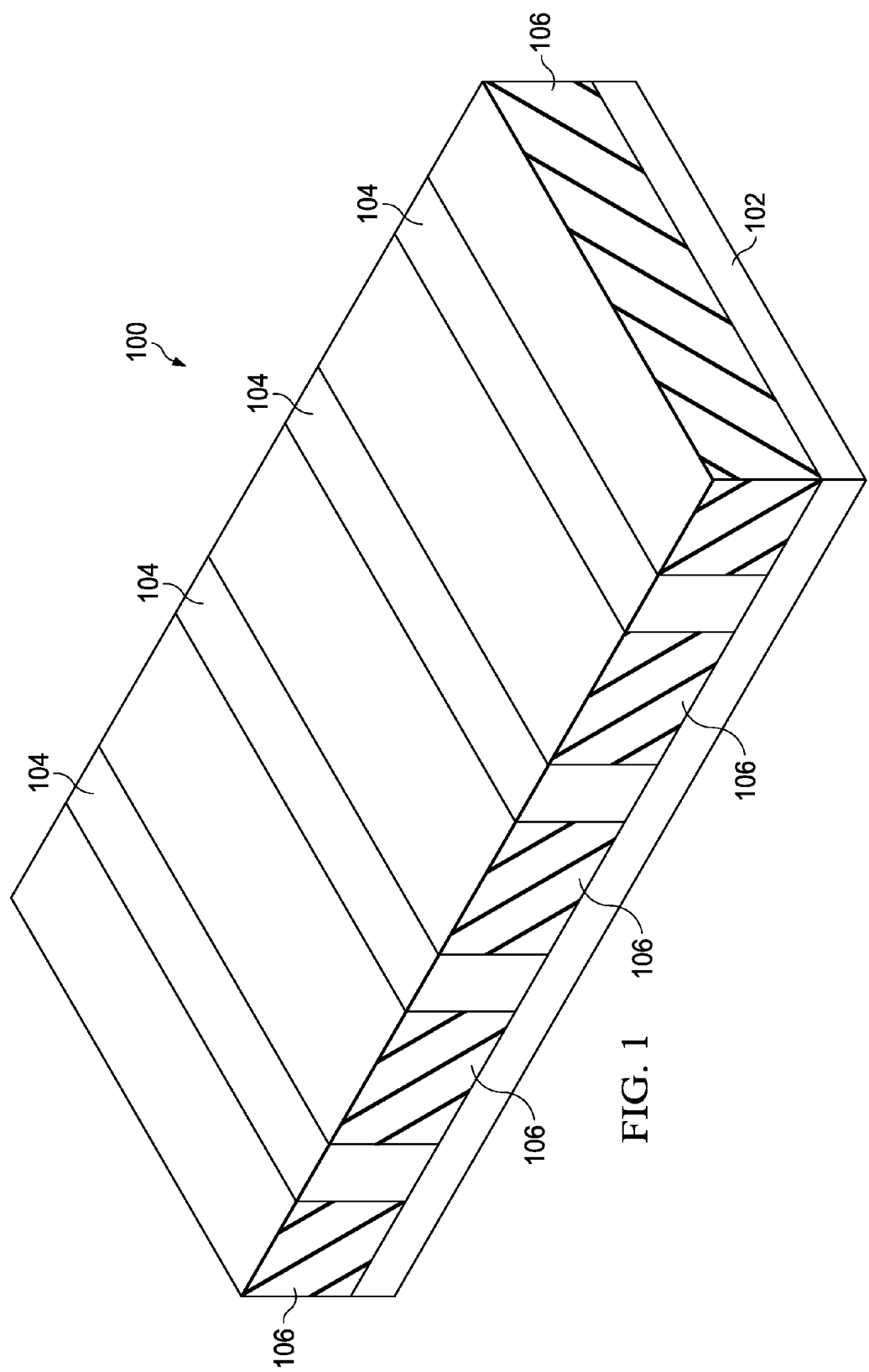

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general terms, the present disclosure is a contact structure and method of forming the same to have a reduced contact resistance ($R_{csd}$). In particular, embodiments such as those disclosed below reduce the $R_{csd}$ of the contact structure of source and drain regions of FinFETs. This reduction in $R_{csd}$ is achieved by both lowering of the Schottky barrier height and increasing of the doping density (see Equation (1) below). The Schottky barrier height is lowered and the doping density is increased in part from the source and drain regions having a high strain and high doping concentration with a dopant segregation design, band alignment tuning, and selective local high-temperature heating to reduce interface defects.

Figure 11A:
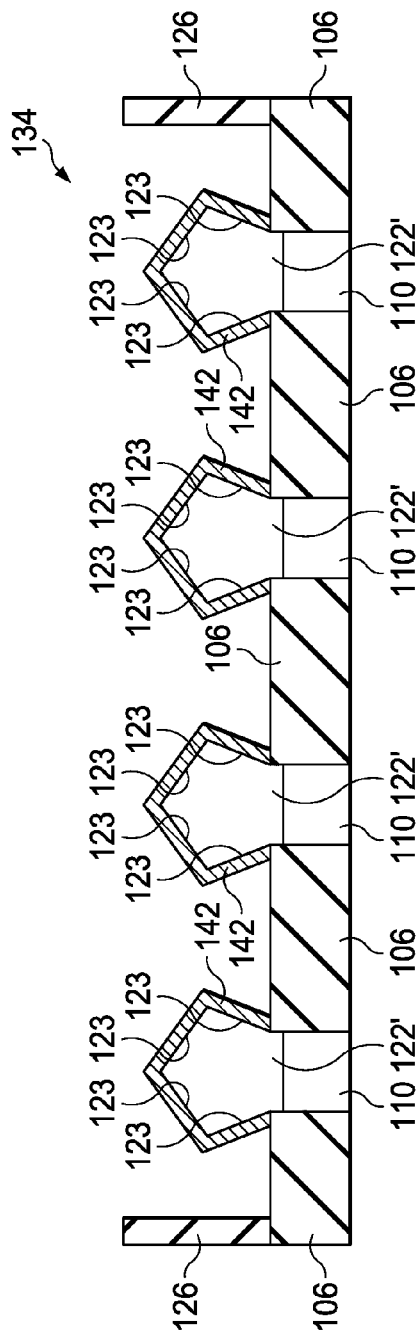
Figure 11C:
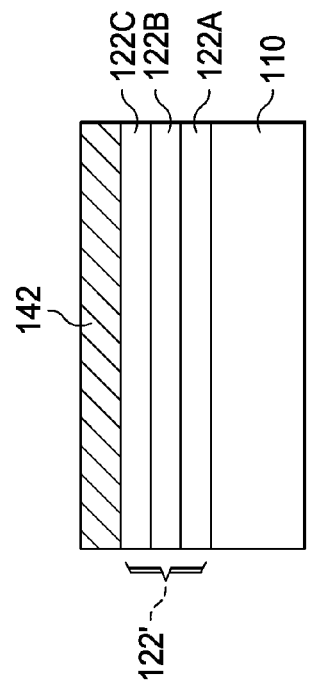
Figure 11B:
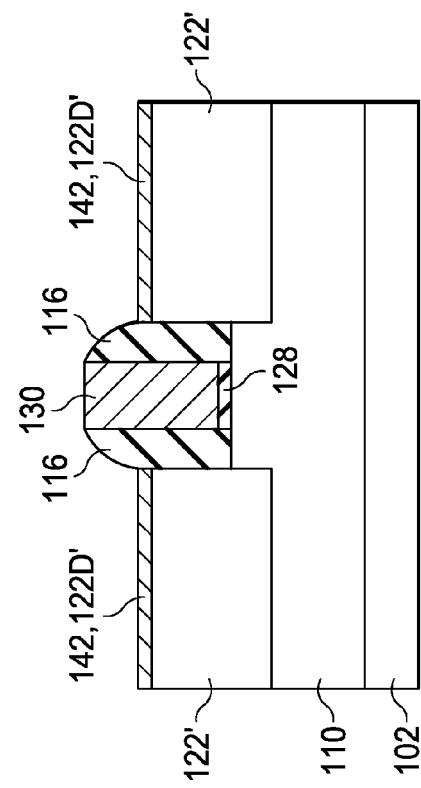
Figure 12:
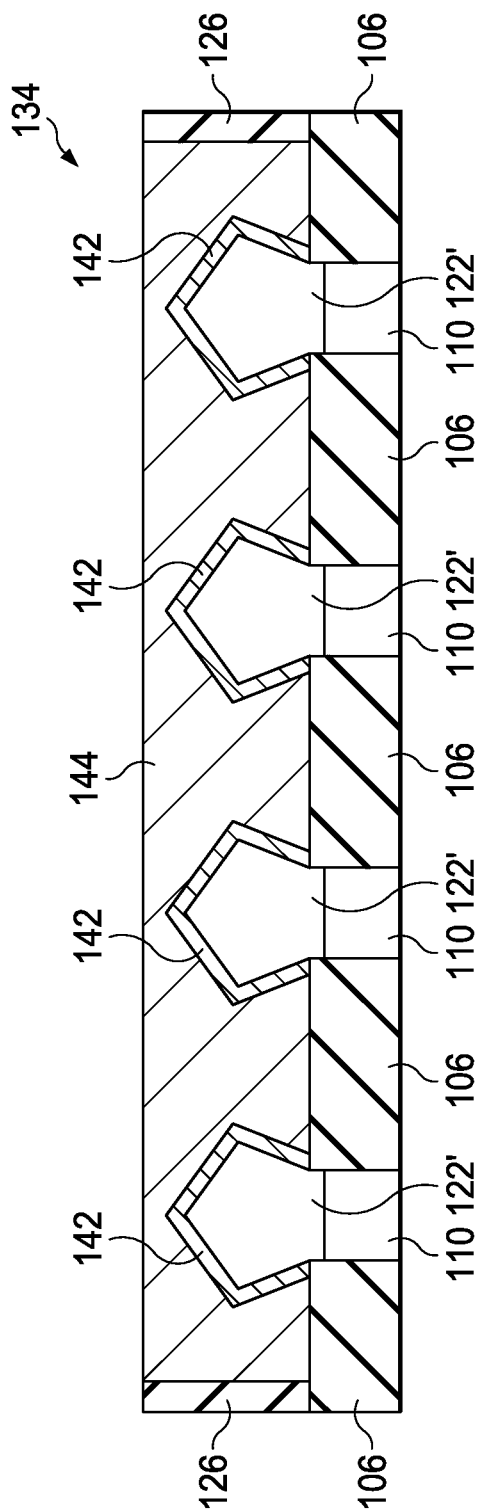
Figure 13:
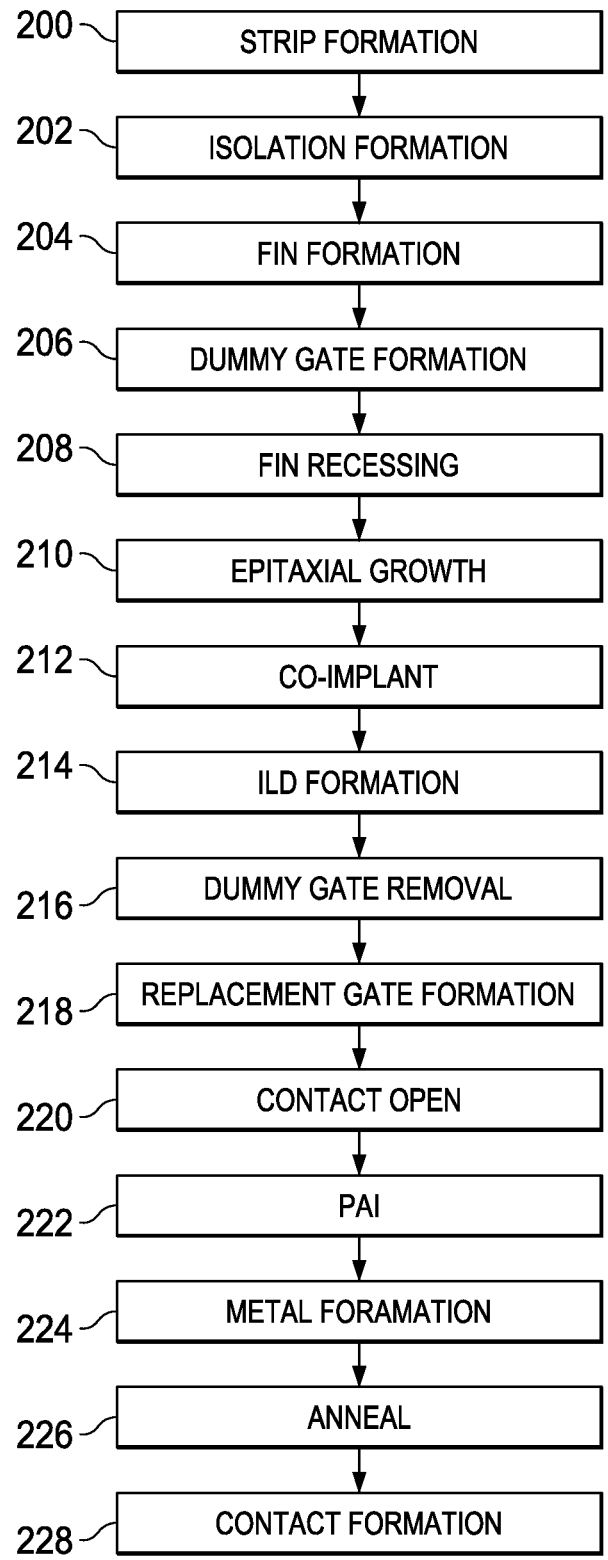
FIG. 13 illustrates a method of manufacturing a FinFET in accordance with some embodiments.

FIGS. 1 through 12 are cross-sectional and perspective views of intermediate stages in the manufacturing of a Fin Field-Effect Transistor (FinFET) in accordance with some embodiments, and FIG. 13 is a process flow of the process shown in FIGS. 1 through 12.

FIG. 1 illustrates a perspective view of an initial structure. The initial structure includes wafer 100 including substrate 102, semiconductor strips 104, and isolation regions 106. The substrate 102 may comprise a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 102 may comprise a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 102 may be doped with a p-type dopant, such as boron, aluminum, gallium, or the like, although the substrate may alternatively be doped with an n-type dopant, as is known in the art.

The substrate 102 may include active devices (not shown in FIG. 1). As one of ordinary skill in the art will recognize, a wide variety of devices such as transistors, capacitors, resistors, combinations of these, and the like may be used to generate the structural and functional requirements of the design for the FinFET. The devices may be formed using any suitable methods. Only a portion of the substrate 102 is illustrated in the figures, as this is sufficient to fully describe the illustrative embodiments.

Semiconductor strips 104 (step 200) and isolation regions 106 (step 202) are formed over the substrate 102. The isolation regions 106 extend from a top surface of the substrate 102 into the substrate 102. The isolation regions 106 may be Shallow Trench Isolation (STI) regions, and are referred to as STI regions 106 hereinafter. The formation of the STI regions 106 may include etching the substrate 102 to form trenches (not shown), and filling the trenches with a dielectric material to form the STI regions 106. The STI regions 106 may be formed of silicon oxide deposited by a high density plasma, for example, although other dielectric materials formed according to various techniques may also be used. The portion of the substrate 102 between neighboring STI regions 106 is referred to as a semiconductor strip 104 throughout the description. The top surfaces of the semiconductor strips 104 and the top surfaces of the STI regions 106 may be substantially level with each other, such as by performing a chemical mechanical polish (CMP) after depositing the material of the STI regions 106, although the surfaces may be at slightly different levels.

Figure 2:
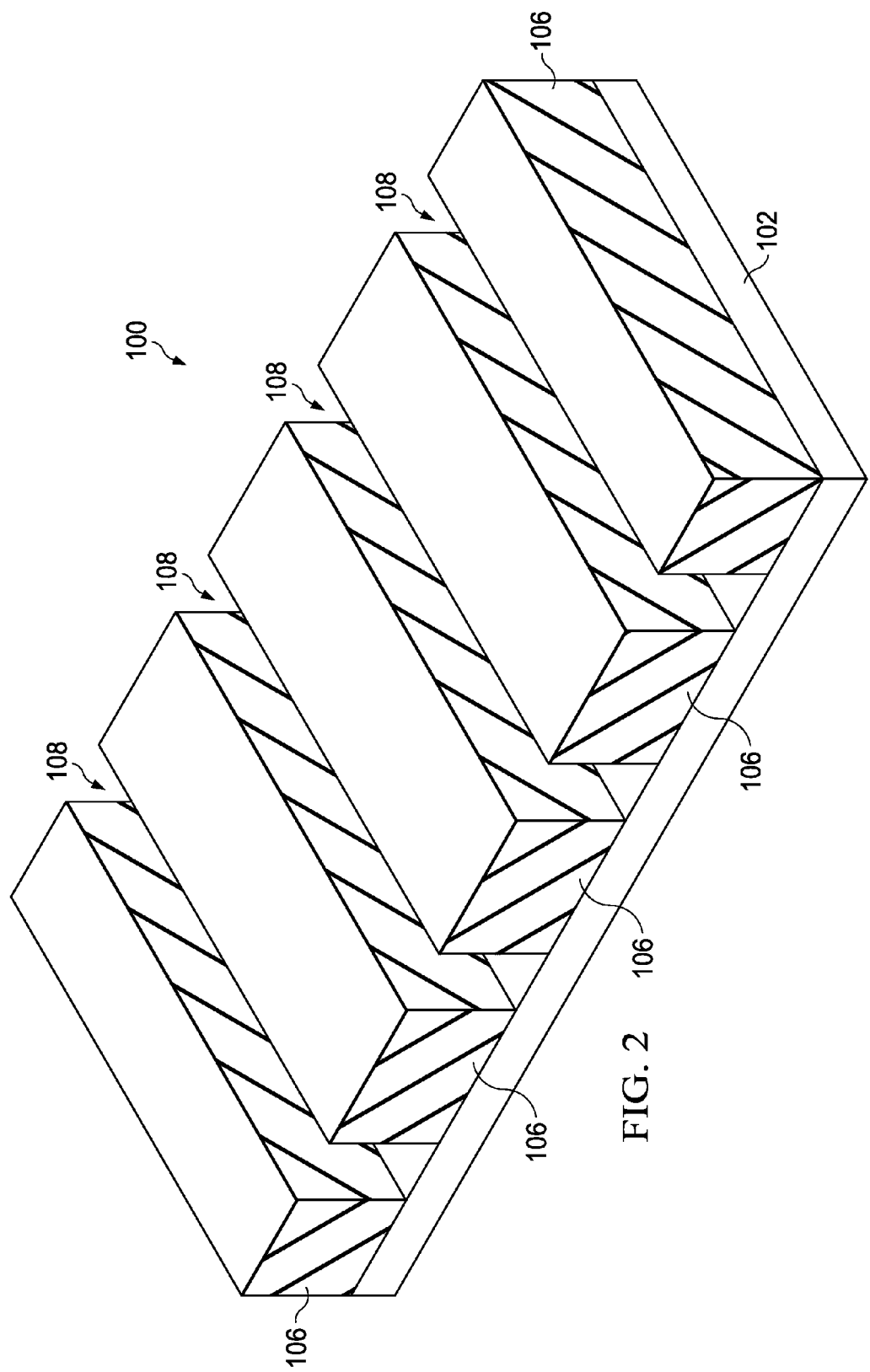
Figure 3:
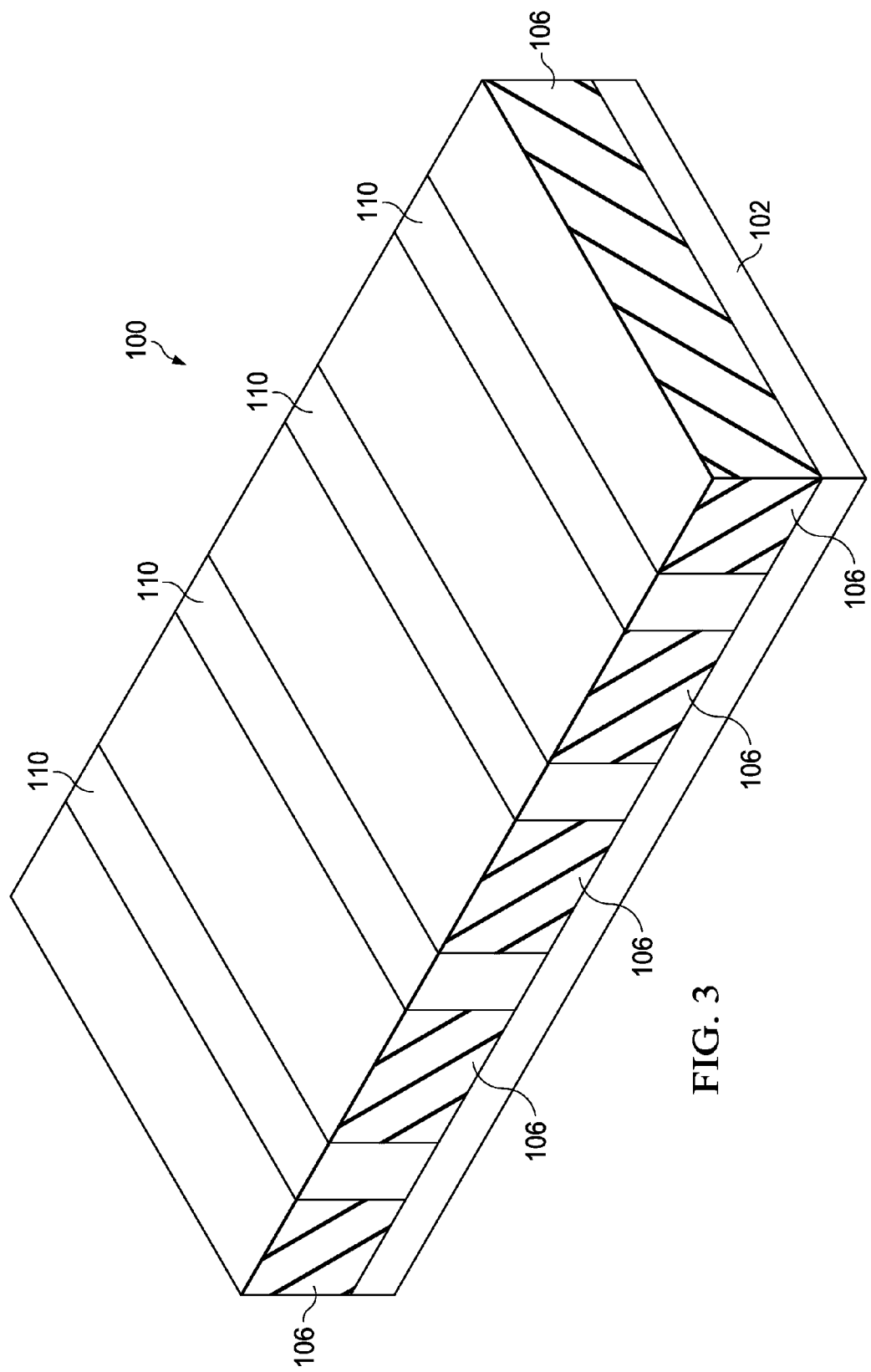

FIGS. 2 and 3 illustrate the replacement of the semiconductor strips 104 in FIG. 1 with semiconductor strips 110 in FIG. 3 in accordance with some embodiments. In alternative embodiments, the semiconductor strips 104 in FIG. 1 are not replaced, and hence act as semiconductor strips 110 shown in FIGS. 4 through 12. Referring to FIG. 2, at least the upper portions, or substantially entireties, of the semiconductor strips 104 are removed. Accordingly, recesses 108 are formed in the STI regions 106. Next, an epitaxy is performed to epitaxially grow semiconductor strips 110 in recesses 108, forming the structure in FIG. 3. The semiconductor strips 110 may have a lattice constant greater than, substantially equal to, or smaller than, the lattice constant of substrate 102. In some embodiments, semiconductor strips 110 comprise silicon germanium (SiGe), a III-V compound semiconductor, or the like. The silicon germanium in semiconductor strips 110 may have a germanium atomic percentage greater than about 15 percent, or between about 15 percent and about 60 percent. The germanium atomic percentage may also be higher, and semiconductor strips 110 may be substantially pure germanium regions with a germanium atomic percentage higher than, for example, about 95 percent. During the epitaxy of the semiconductor strips 110, a p-type impurity such as boron may be in-situ doped with the epitaxy. The STI regions 106 are then recessed, so that top portions of the semiconductor strips 110 are higher than the top surfaces of the STI regions 106 to form semiconductor fins 110' (step 204) (see FIG. 4).

Figure 4:
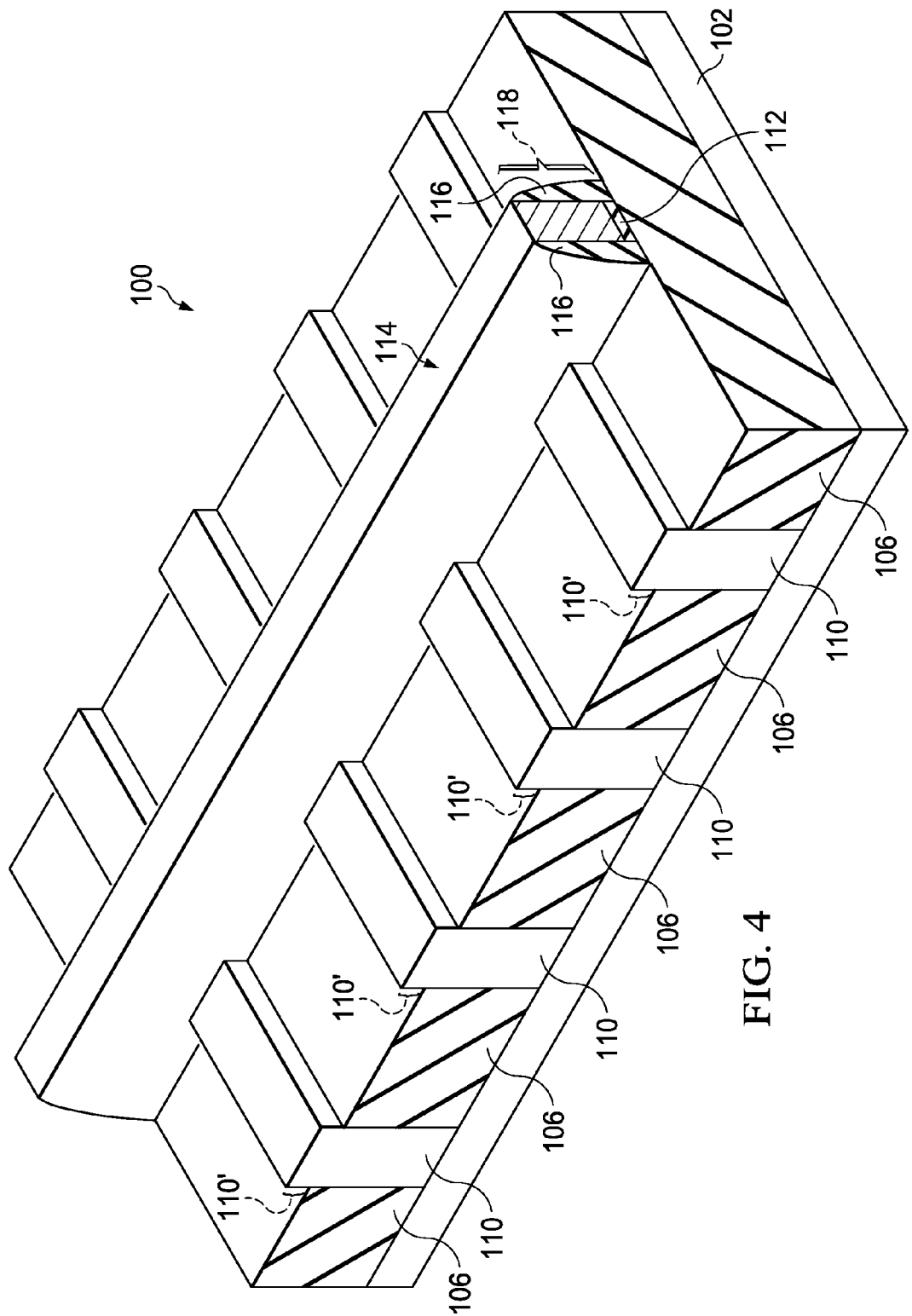

In FIG. 4, a gate structure 118 is formed over the semiconductor fins 110'. The gate structure 118 includes a gate dielectric 112, a gate electrode 114, and gate spacers 116. The gate structure 118 crosses over a plurality of the semiconductor fins 110' and the STI regions 106. The gate structure 118 has a longitudinal axis that is substantially perpendicular to the longitudinal axes of semiconductor fins 110'. In some embodiments, the gate structure 118 is a dummy gate structure (step 206) and will be replaced with a replacement gate structure using a "gate-last" or replacement-gate process. In other embodiments, the gate structure 118 is an active gate and is formed in a "gate-first process" and will not be replaced.

A gate dielectric layer (not shown) may be formed and patterned to form the gate dielectric 112. The gate dielectric layer may be formed over the fins 110' and the STI regions 106 by thermal oxidation, chemical vapor deposition (CVD), a spin-on-glass process, sputtering, or any other methods known and used in the art for forming a gate dielectric layer. In some embodiments, the gate dielectric layer may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, the like, or a combination thereof. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

After the gate dielectric layer is formed, a gate electrode 114 is formed over the gate dielectric layer. The gate electrode 114 may be formed by first forming a gate electrode layer (not shown) over the fins 110' and the STI regions 106 and then patterning the gate electrode layer and the gate dielectric layer to form the gate electrode 114 and gate dielectric 112. In some embodiments, the gate electrode layer is a conductive material and may be selected from a group comprising polycrystalline-silicon (poly-Si), poly-crystalline silicon-germanium (poly-SiGe), metallic nitrides, metallic silicides, metallic oxides, and metals. In an embodiment, the gate electrode layer includes a metal-containing material such as TiN, TaN, TaC, Co, Ru, Al, combinations thereof, or multi-layers thereof. The gate electrode layer may be deposited by CVD, physical vapor deposition (PVD), sputter deposition, or other techniques known and used in the art for depositing conductive materials. The top surface of the gate electrode layer may have a non-planar top surface and may be planarized by, for example, performing a CMP process after it is deposited. A mask layer (not shown)—such as a photoresist, hard mask, combinations thereof, or multi-layers thereof—may be formed and patterned over the gate electrode layer. The patterned mask layer may then be transferred to the material of the gate electrode layer using acceptable photolithography and etching techniques to form the gate electrode 114 and the gate dielectric 112.

The gate spacers 116 may be formed on opposite sides of the gate electrode 114. The gate spacers 116 are typically formed by blanket depositing a spacer layer (not shown) over the semiconductor fins 110', the gate electrode 114, the gate dielectric 112, and the STI regions 106. In an embodiment, the gate spacers 116 may include a spacer liner (not shown) comprising SiN, SiC, SiGe, oxynitride, oxide, combinations thereof, or the like. The spacer layer may comprise SiN, oxynitride, SiC, SiON, oxide, combinations thereof, or the like and may be formed by methods utilized to form such a layer, such as CVD, plasma enhanced CVD (PECVD), sputter deposition, the like, or any other suitable deposition method. The gate spacers 116 are then patterned, for example, by an anisotropic etching process that removes the spacer layer from the horizontal surfaces of the gate electrode 114, the fins 110', and the STI regions 106.

Figure 5:
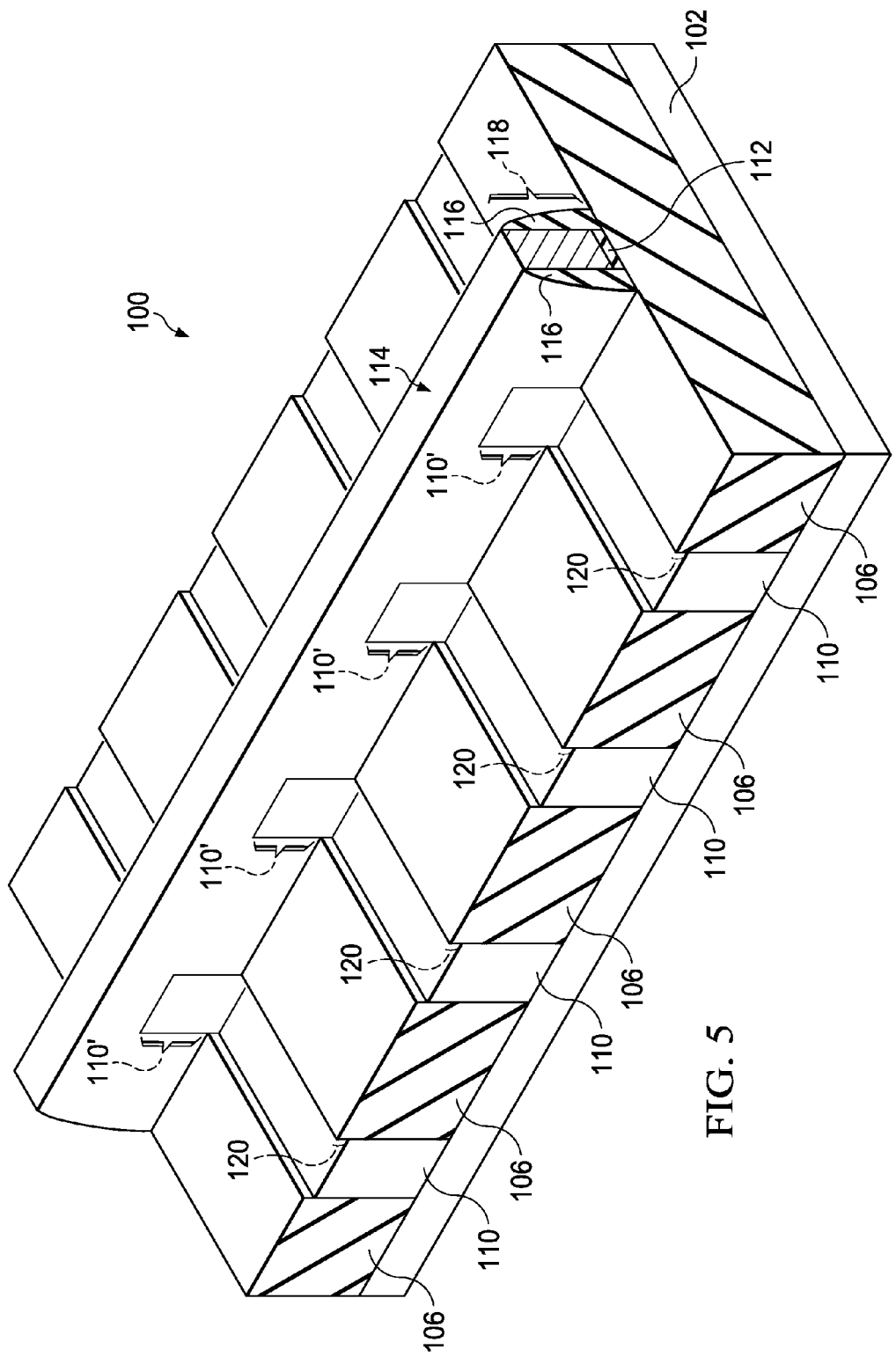

Referring to FIG. 5, an etching step is performed to recess portions of the semiconductor fins 110' that are not covered by gate structure 118 (step 208). The resulting top surfaces of the recessed semiconductor fins 110 may thus be substantially level with or lower than the top surfaces of the STI regions 106. Recesses 120 are accordingly formed between STI regions 106. The recesses 120 are located on opposite sides of the gate structure 118.

Figure 6A:
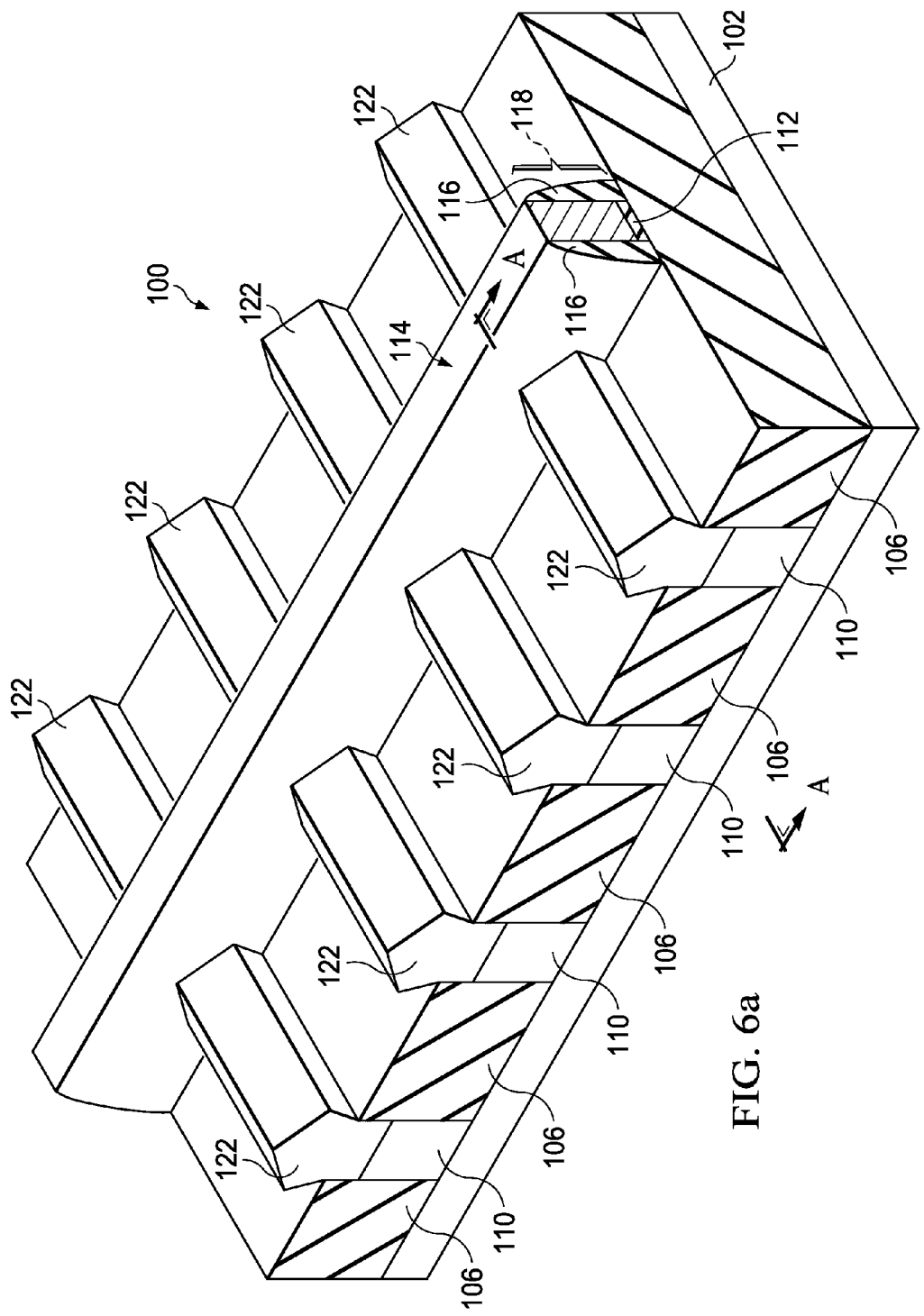
Figure 6B:
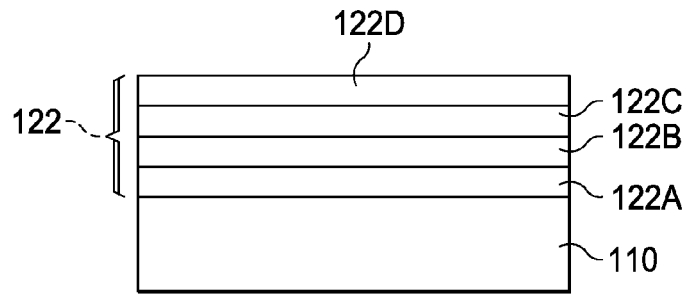

FIGS. 6a and 6b illustrate the formation of epitaxial regions 122 (step 210) with FIG. 6b illustrating a cross-sectional view of a single epitaxial region 122 along a vertical plane containing line A-A in FIG. 6a. In some embodiments, the epitaxial regions 122 are a strained material stack 122. The lattice constants of the strained material stack 122 are different from a lattice constant of the semiconductor fins 110. As a result, the channel regions of the FinFETs under the gate structures 118 are strained or stressed to enhance carrier mobility of the device.

In some embodiments, a pre-cleaning process is performed to clean recesses 120 with an HF-based gas, a SiCoNi-based gas, or other suitable solution prior to forming the strained material stack 122. In some embodiments, the strained material stack 122 comprises Si, Ge, SiGe, SiC, SiP, GeSn, SiGeSn, a P-type dopant, an N-type dopant, a III-V semiconductor material, the like, or a combination thereof. In some embodiments, the strained material stack 122 includes a plurality of epitaxial layers 122A, 122B, 122C, and 122D. In p-type FinFET embodiments, a first layer 122A is boron-doped SiGe (SiGeB), a second layer 122B is SiGeB, and a fourth layer is 122D is SiGeB. In some embodiments, each of the SiGeB layers (122A, 122B, and 122D) have different concentrations of Si, Ge, and/or B. In some embodiments, the third layer 122C is tin-doped SiGe (SiGeSn), GeSn, or B-doped GeSn (GeSnB). The epitaxial layer 122A, 122B, 122C, and 122D assist in the formation of a low resistance metal silicide and/or metal germanide compound on the strained material stack 122. In n-type FinFET embodiments, the SiGeB layers may be replaced with SiP layers and the epitaxial layers 122 may be doped with N-type dopants.

For advanced technologies, the critical dimension (CD) of contacts continues to decrease. Metal silicides have been used to provide connection between the S/D regions and contact plugs (or contacts) with low resistivity. Equation (1) below shows the relationship between resistivity of a conductive material, such as a metal silicide or metal germanide, formed next to a semiconductor material and factors affecting resistivity.

$$p_c = p_{co} \exp\left(\frac{2\varphi_B}{qh} \sqrt{\frac{\varepsilon_s m^*}{N}}\right) \quad \text{Equation (1)}$$

In Equation (1), $p_{co}$ is a constant dependent upon the metal and the semiconductor material, $\varphi_B$ is the Schottky barrier height (SBH), $m^*$ is the effective mass of the semiconductor material, and N is the doping density in the semiconductor material.

The specific contact resistivity $p_c$ can be reduced in a number of ways. One way is to decrease the SBH $\varphi_B$. The SBH $\varphi_B$ can be decreased by tuning the band alignment, reducing the defects at the interface of metal-silicide and the semiconductor material, and by a dopant segregation dopant design. Another way to reduce the specific contact resistivity $p_c$ is to increase the doping density N. The doping density N can be increased by providing more dopants in the strained material stack 122, both from in-situ doping during the epitaxial process and from implantation methods.

The strained material layers 122 may be sequentially and selectively grown by low-pressure CVD (LPCVD) processes, a liquid phase epitaxial process, a molecular beam epitaxial process, a vapor phase epitaxial process, or a combination thereof to fill the recesses 122. The reaction gases used to form the strain material stack 122 include various combinations of $SiH_4$, $SiH_2$, $Cl_2$, HCl, $GeH_4$, $Ge_2H_6$, $B_2H_6$, and $H_2$, in some embodiments.

The first layer 122A is formed on the surfaces of recesses 120. In an embodiment, the first layer 122A is formed of SiGeB. In some embodiments, the Ge concentration (atomic %) in the first layer 122A is in a range from about 15% to about 30%. In some embodiments, the thickness of the first layer 122 is in a range from about 10 nm to about 30 nm.

The second layer 122B is then formed over the first layer 122A. In an embodiment, the second layer 122B is formed of SiGeB. In some embodiments, the concentration of Ge in the second layer 122B is graded and increases in a direction from the first layer 122A to the third layer 122C. In some embodiments with the graded Ge concentration, the concentration of Ge in the second layer 122B increases from the concentration of Ge in the first layer 122A to a higher value that is closer to the concentration of Ge in the third layer 122C. In some embodiments with the graded Ge concentration, the concentration of Ge in the second layer 122B increases in a range from about 30% to about 80% from bottom to top of the layer. In an embodiment, the thickness of the second layer 122B is in a range from about 10 nm to about 30 nm.

The third layer 122C is then formed over the second layer 122B. In some embodiments, the third layer is formed of SiGeSn, GeSn, or GeSnB. The third layer is configured to act as a band alignment layer for second layer 122B below it and the subsequent metal-silicide layer 142 above it (see FIGS. 11a through 11c). By aligning the bands of these layers, the third layer 122C reduces the SBH at the interface of the subsequent metal-silicide 142 and the strained material stack 122. The third layer 122C may also be doped with B to provide a source for dopant segregation. The third layer 122C may be a strained layer or may be relaxed layer depending on the doping profile of the third layer 122C. In some embodiments, the concentration of Ge in the third layer 122C is in a range from about 50% to about 95%. In some embodiments, the concentration of Sn in the third layer 122C is in a range from about 0.1% to about 9%. In some embodiments, the thickness of the third layer 122C is in a range from about 1 nm to about 10 nm.

The fourth layer 122D is then formed over the third layer 122C. In some embodiments, the fourth layer 122D is formed of SiGeB. The fourth layer 122D is configured to reduce or prevent galvanic corrosion caused by the difference in the chemical potential between the third layer 122C and the metal-silicide layer 142 (see FIGS. 11a through 11c). The fourth layer 122D may also be doped with B to provide a source for dopant segregation. In some embodiments, the concentration of Ge in the third layer 122C is in a range from about 15% to about 50%. In some embodiments, the thickness of the fourth layer 122D is in a range from about 2 nm to about 10.

Figure 7B:
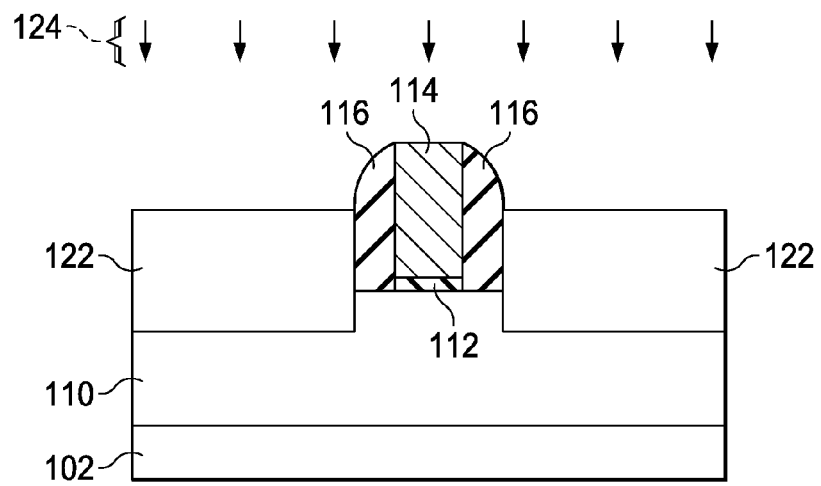
Figure 7C:
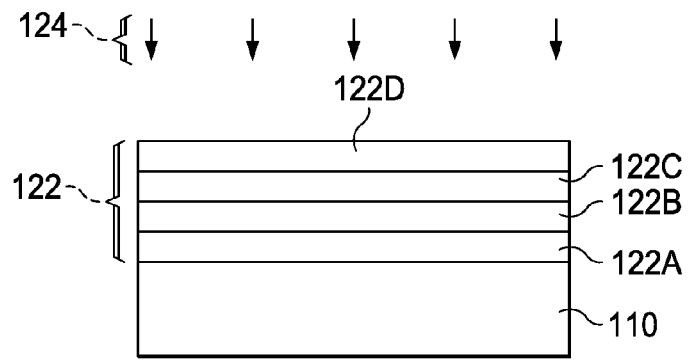
Figure 7A:
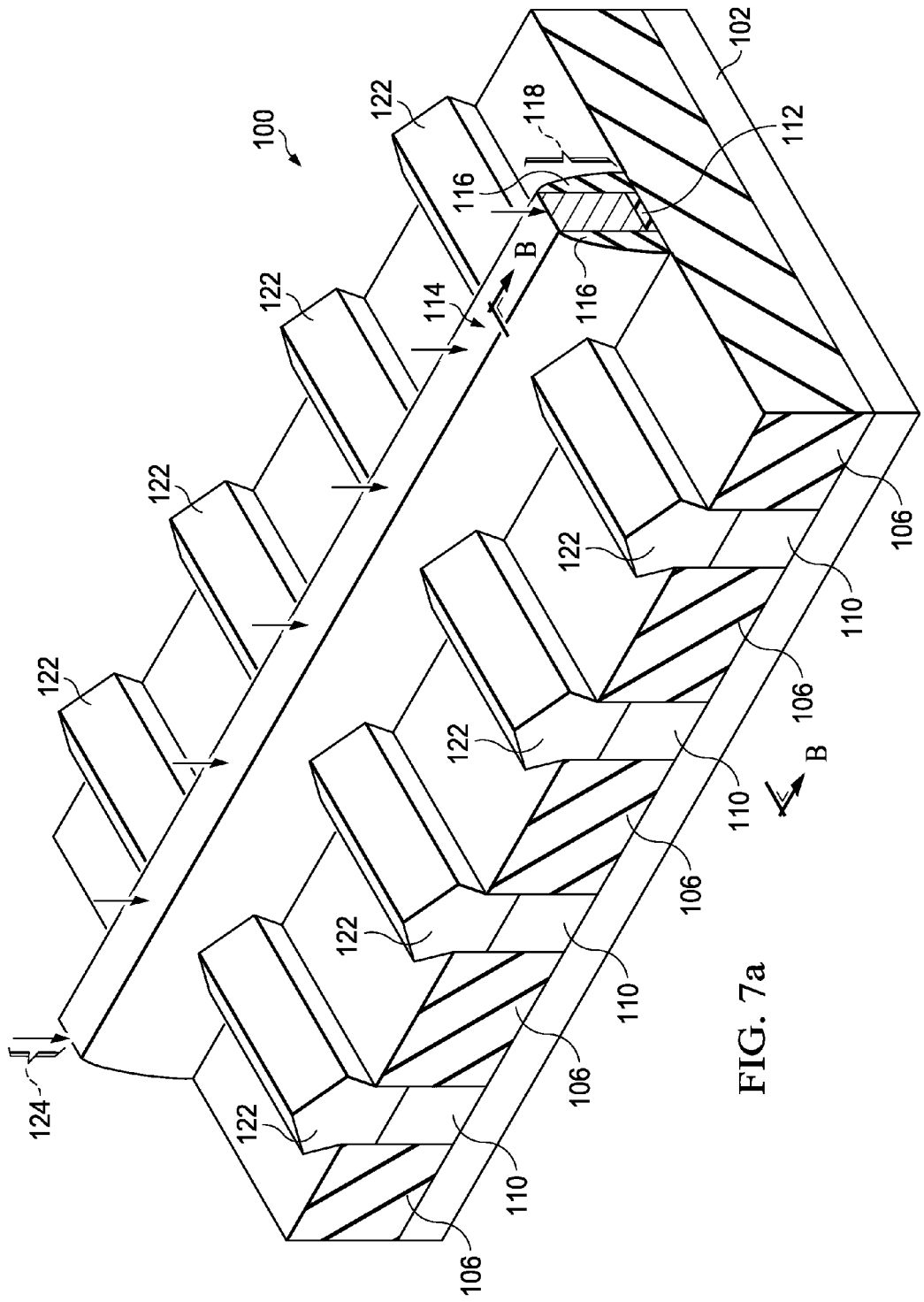

Referring to FIGS. 7a, 7b, and 7c, a co-implantation process 124 is performed on the strained material stacks 122 (step 212). FIG. 7b illustrates a cross-sectional view of the semiconductor fin 110' along a vertical plane including the line B-B in FIG. 7a, and FIG. 7c illustrates the cross-sectional view of a single strained material stack 122 along line A-A in FIG. 6a. The co-implantation process 124 increases the concentrations of dopants for band alignment tuning and dopant segregation. In some embodiments, the dopant concentrations after the epitaxial formation of the strained material stacks 122 are not high enough to ensure sufficient band alignment tuning and/or dopant segregation such that the specific contact resistance of the contact structure may be adversely affected without the inclusion of the co-implantation process 124.

In some embodiments, the co-implantation process 124, such as a plasma doping (PLAD) process, implants B, indium (In), Sn, antimony (Sb), the like, or a combination thereof. The additional doping of these dopants creates more donor and acceptor-like states which will effectively reduce the SBH between the strained material stacks 122 and the subsequently formed metal-silicide 142 (see FIGS. 11a through 11c). In some embodiments, the co-implantation process 124 is a low energy implantation process performed with energy in a range from about 1 kiloelectron volt (keV) to about 10 keV. In an embodiment, the co-implantation process 124 provides an implant dose in a range from about 1E13 atoms/cm$^2$ to about 5E15 atoms/cm$^2$. After the co-implantation process, at least one or both of the third and fourth layers 122C and 122D has a B concentration in a range from about 1E20 atoms/cm$^3$ to about 8E20 atoms/cm$^3$.

Figure 8:
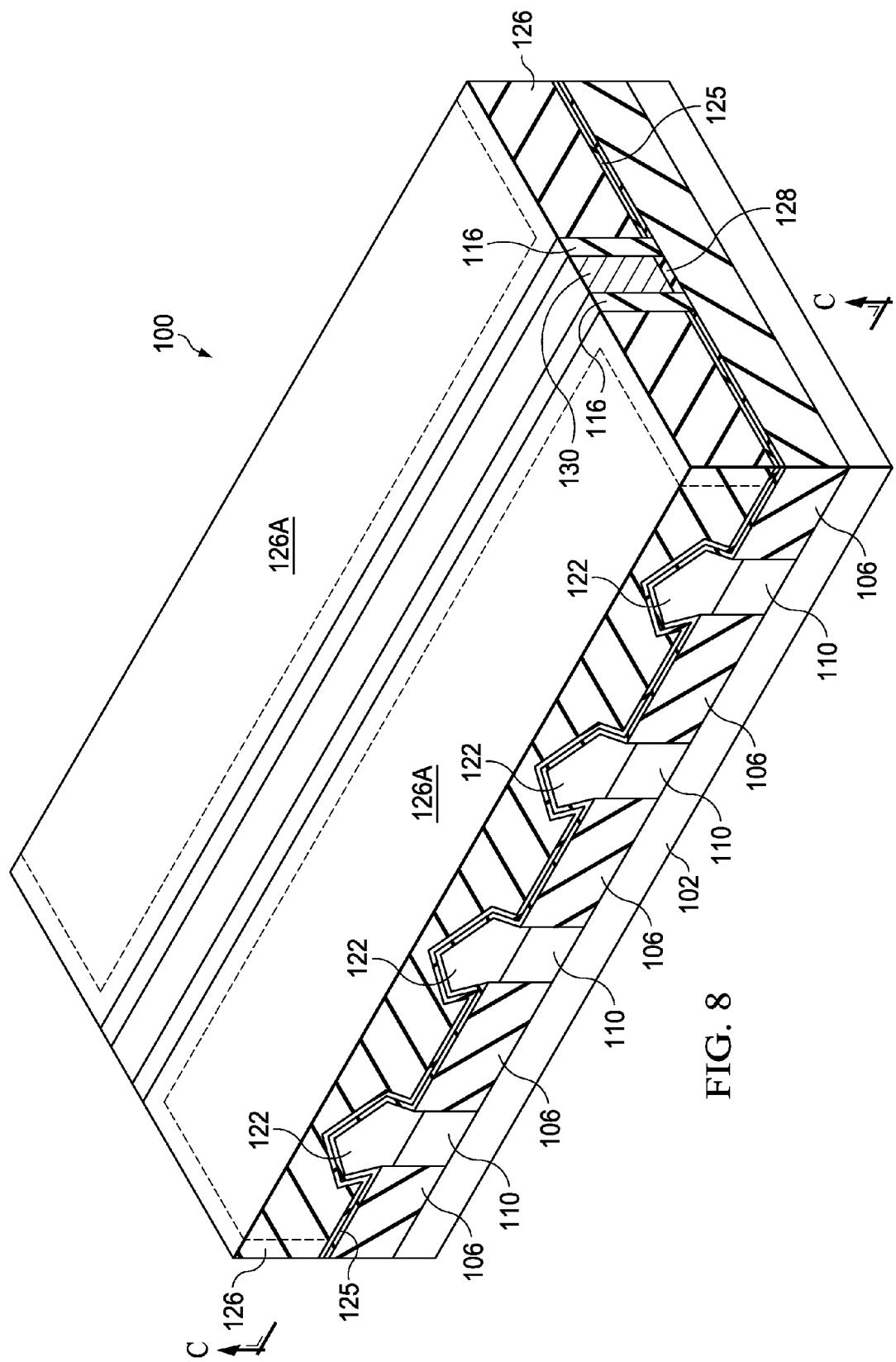

FIG. 8 illustrates a perspective view of the structure after an etch stop layer (ESL) 125 and an inter-layer dielectric (ILD) layer 126 are formed. The ESL 125 is formed over the gate spacers 116, the gate electrode 114 (shown as replacement gate 130 in FIG. 8), the strained material stacks 122 (may be referred to as the source/drain regions 122), the fins 110', and the STI regions 106. The ESL 125 may be conformally deposited over components on the substrate 102. In an embodiment, the ESL is formed of SiN, SiCN, SiON, the like, or a combination thereof and is formed by atomic layer deposition (ALD), molecular layer deposition (MLD), a furnace process, CVD, PECVD, the like, or a combination thereof. In some embodiments, there may be a buffer oxide (not shown) formed before the ESL 125.

After the ESL 125 is formed, the ILD 126 may be formed over the ESL 125. The ILD 126 may be conformally deposited over the ESL 125. In an embodiment, the ILD may comprise SiO$_2$, SiON, the like, or a combination thereof. The ILD 126 may be formed by CVD, ALD, PECVD, subatmospheric CVD (SACVD), flowable CVD, a high density plasma (HDP), a spin-on-dielectric process, the like, or a combination thereof.

The ILD 126 may be planarized by using a CMP process to remove portions of the ILD 126. In other embodiments, other planarization techniques may be used, such as etching. In the replacement-gate embodiments, the dummy gate electrode 114 and the dummy gate dielectric 112 may be removed (step 216). The dummy gate electrode 114 and the gate dielectric 112 may be removed by any suitable etching process.

After the dummy gate electrode 114 and the dummy gate dielectric 112 are removed, a replacement gate dielectric 128 and a replacement gate electrode 130 may be formed in their place (step 218). The replacement gate dielectric 128 and the replacement gate electrode 130 may be similar to the gate dielectric 112 and the gate electrode 114 described above and the descriptions are not repeated herein.

Next, portions 126A of the ILD 126 are removed to form contact openings (step 226). These contact openings are formed through the ILD 126 on both sides of the gate electrode 130. One of the contact openings 134 is illustrated in FIG. 9a. FIGS. 9a, 10a, 11a, and 12 are cross-sectional views along a vertical plane containing line C-C as shown in FIG. 8. FIGS. 9b and 9c are along similar planes as FIGS. 7b and 7c, respectively. The Figures in FIGS. 10 and 11 also are along similar planes, respectively, as FIGS. 9a, 9b, and 9c.

Referring to FIGS. 9a, 9b, and 9c, a contact opening 134 is located in the ILD 126. The source and drain regions 122 (strained material stacks 122) include a plurality of spade-shaped epitaxial regions separated from each other. The source and drain regions 122 have facets 123. The facets 123 include upward facing facets and downward facing facets. The facets 123 may be on <111> planes of the source and drain regions 122. As illustrated in the FIG. 9a, the buffer oxide layer, if present in the embodiment, and the ESL 125 have been removed from the contact opening 134. The buffer oxide and the ESL 125 may be removed by an etching step and the facets 123 of the source and drain regions 122 are exposed. A pre-clean step may be performed on the exposed facets 123. The pre-clean may be performed using, for example, an HF-based gas, a SiCoNi-based gas, or other suitable solution. The pre-clean may remove the native silicon oxide that is formed as a result of the nature oxidation of the exposed surfaces of source and drain regions 122.

After the ESL 125 is removed, a pre-amorphization implant (PAI) 136 is performed on the source and drain regions 122 (step 222). The PAI 136 implants the source and drain regions 122 to damage the source and drain regions 122 and to form amorphized regions (not shown). In some embodiments, the amorphized regions extend laterally and may extend under the gate spacers 116. The PAI 136 may implant the source and drain regions 122 with Si or Ge, in accordance with some embodiments. The depth of the amorphized regions may be controlled by parameters of the PAI 136, such as implant energy, implant species, and implant dosage. The PAI 136 may be performed using, for example, a Ge PAI performed using an implant energy of about 5 keV to about 35 keV and an implant dose of about 5E14 atoms/cm$^2$ to about 1E15 atoms/cm$^2$.

FIGS. 10a, 10b, and 10c illustrates the formation of a metal layer 140 on the facets 123 of the source and drain regions 122 (step 224). The metal layer 140 may be formed of nickel (Ni), titanium (Ti), Cobalt (Co), the like, or a combination thereof. The metal layer 140 may be formed using conformal deposition methods, such as ALD, PVD, or the like, causing the metal layer 140 is formed on both the upward and downward facing facets 123 of the source and drain regions 122. In an embodiment, the metal layer 140 has a thickness in a range from about 20 Å to about 300 Å.

FIGS. 11a, 11b, and 11c illustrate annealing the metal layer 140 and the source and drain regions 122 (step 226) to form a metal-silicide layer 142 on the source and drain regions 122. In some embodiments, the annealing process is a microwave anneal (MWA) process. The annealing process causes the metal layer 140 to react with the source and drain regions 122 to form the metal-silicide layer 142. In an embodiment, the metal-silicide layer 142 consumes substantially the entire fourth layer 122D of the source and drain regions 122'. In some embodiments, the metal layer 140 is partially consumed and portions of the unreacted metal layer 140 may remain over the metal-silicide layer 142 and may be removed by an etching or cleaning process. The metal-silicide layer 142 may be formed of NiSi, TiSi$_x$, the like, or a combination thereof.

In some embodiments, the annealing process is a multi-stage MWA process. For example, the MWA process may include a first stage of the MWA that is operated at a temperature from about 350° C. to about 550° C. for a duration of about 50 seconds to about 100 seconds and for the second stage at a temperature of about 500° C. to about 600° C. for a duration of about 50 seconds to about 180 seconds. In some embodiments, the temperature of each of the stages does not go over 600° C. to prevent the diffusion of the gate electrode 130 comprising a metal such as Al and to prevent the deactivation of dopants.

For advanced device manufacturing that prohibits high temperature processing at this process operation, a MWA process may be used for the annealing process. The MWA process can be tuned to locally increase temperature of a particular structure, layer, or region, such as near the interface between the metal layer 140 and the semiconductor material source and drain regions 122, to a much higher value than the substrate/wafer 102 or other surrounding structures, layers, or regions. For example, the interface between the metal layer 140 and the semiconductor material source and drain regions 122 may be heated to a temperature of about 1000° C. to about 1100° C. while the wafer/substrate 102 and other areas of the device do not exceed 600° C. In addition, the MWA process may dissolve most of the clustering/interfacial defects which will reduce the SBH that is caused by the defects without the penalties of diffusion of metals in other parts of the device structure (e.g. gate electrode). Further details on the MWA process and apparatus are found in U.S. patent application Ser. No. 14/250,217, entitled "Microwave Anneal (MWA) for Defect Recovery," and filed on Apr. 10, 2014, which is incorporated herein by reference in its entirety.

Referring to FIG. 12, the remaining contacting opening 134 is filled with a conductive material (step 228). After the filling of the conductive material, a CMP process is performed to remove the excess portion of the conductive material, and the remaining conductive material in opening 134 forms contact plug 144. In some embodiments, the contact plug 144 comprises tungsten (W). In alternative embodiments, the contact plug 144 comprises other metal or metal alloys such as aluminum, copper, or the like.

In an n-type FinFET embodiment with a W contact plug 144, a NiSi metal-silicide layer 142, and a SiP source and drain region 122', the Schottky barrier height is about 0.75 eV. In an n-type FinFET embodiment with a W contact plug 144, a $TiSi_x$ metal-silicide layer 142, and a SiP source and drain region 122', the Schottky barrier height is about 0.55 eV. Thus, utilizing the present disclosure, the n-type FinFET has a lower Schottky barrier height with a $TiSi_x$ metal-silicide layer 142.

In an p-type FinFET embodiment with a W contact plug 144, a NiSi metal-silicide layer 142, and a SiGe source and drain region 122', the Schottky barrier height is about 0.12 eV. In a p-type FinFET embodiment with a W contact plug 144, a $TiSi_x$ metal-silicide layer 142, and a SiGe source and drain region 122', the Schottky barrier height is about 0.32 eV. Thus, utilizing the present disclosure, the p-type FinFET has a lower Schottky barrier height with a NiSi metal-silicide layer 142. Hence, in some embodiments utilizing both n-type and p-type FinFETs (e.g. CMOS technology), the n-type FinFETs may use $TiSi_x$ metal-silicide layers and the p-type FinFETs may utilize NiSi to provide the lowest contact resistance for both types of FinFETs.

Embodiments such as those disclosed above reduce the contact resistance ($R_{csd}$) of the contact structure of the source and drain regions 122. This reduction in $R_{csd}$ is due to both the lowering of the Schottky barrier height and the increase of the doping density (see Equation (1) above). The SBH is lowered and the doping density is increased in part from the source and drain regions 122 having a high strain and high doping concentration with dopant segregation dopant design, band alignment tuning, and selective local high-temperature heating to reduce interface defects.

An embodiment is a method of manufacturing a semiconductor device, the method including forming a first gate over a substrate, forming a recess in the substrate adjacent the first gate, epitaxially forming a strained material stack in the recess, the strained material stack comprising at least three layers, each of the at least three layers comprising a dopant. The method further includes co-implanting the strained material stack with dopants comprising boron, germanium, indium, tin, or a combination thereof, forming a metal layer on the strained material stack, and annealing the metal layer and the strained material stack forming a metal-silicide layer.

Another embodiment is a method of forming a Fin Field-Effect Transistor (FinFET), the method including forming a plurality of fins extending from a substrate, forming a dummy gate over the plurality of fins, forming recesses in the plurality of fins adjacent the dummy gate, epitaxially forming a plurality of strained material stacks in the recesses in the plurality of fins, each of the strained material stacks comprising a germanium-tin (GeSn) layer and a boron-doped (B-doped) silicon-geranium (SiGeB) layer, and implanting the strained material stacks with B, indium (In), Sn, or a combination thereof. The method further includes forming a metal layer on the strained material stacks, performing a microwave anneal (MWA) process on the metal layer and the strained material stacks to form metal-silicide layers on the strained material stacks, and forming a metal contact to the strained material stacks, the metal contact contacting the metal-silicide layers.

A further embodiment is a semiconductor device including a fin extending from a substrate, a gate on a top surface and sidewalls of the fin, and a strained material stack on the fin adjacent the gate. The strained material stack includes a first boron-doped (B-doped) silicon-germanium (SiGeB) layer, a second SiGeB layer on the first SiGeB layer, the second SiGeB layer having a higher concentration of Ge than the first SiGeB layer, and a B-doped germanium-tin (GeSnB) layer on the second SiGeB layer. The semiconductor device further includes a metal-silicide layer on the GeSnB layer, and a metal contact on the metal-silicide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
providing a substrate having a semiconductor fin extending from the substrate;
forming a first gate structure over the semiconductor fin;
forming a recess in the semiconductor fin adjacent the first gate structure;
epitaxially forming a strained material stack in the recess, the strained material stack comprising at least three sequentially and selectively grown layers, each of the at least three sequentially and selectively grown layers comprising a first dopant, each of the at least three sequentially and selectively grown layers having a dopant concentration;
increasing the dopant concentration of a first subset of the at least three sequentially and selectively grown layers, the increasing comprising co-implanting the first subset of the strained material stack with second dopants comprising boron, germanium, indium, tin, or a combination thereof;

forming a metal layer on the strained material stack; and locally annealing the metal layer and the strained material stack at a higher temperature than the substrate and the first gate structure to form a metal-silicide layer.

2. The method of claim 1 further comprising:

before the forming the metal layer on the strained material stack, performing a pre-amorphization implant on the strained material stack, the pre-amorphization implant comprising implanting germanium dopants into the strained material stack.

3. The method of claim 2, wherein the performing the pre-amorphization implant on the strained material stack is performed after the co-implanting the strained material stack with dopants.

4. The method of claim 1, wherein the locally annealing the metal layer and the strained material stack comprises performing a multi-stage microwave anneal (MWA) process on the metal layer and the strained material stack.

5. The method of claim 4, wherein frequency of the multi-stage MWA process is in a range from about 5 GHz to about 10 GHz.

6. The method of claim 4, wherein substrate temperature of a first stage of the multi-stage MWA process is in a range from about 350° C. to about 550° C.

7. The method of claim 1, wherein the epitaxially forming the strained material stack in the recess further comprises:

epitaxially forming a first boron-doped (B-doped) silicon-germanium (SiGeB) layer;

epitaxially forming a second SiGeB layer on the first SiGeB layer, the second SiGeB layer having a higher concentration of germanium than the first SiGeB layer;

epitaxially forming a tin-doped (Sn-doped) germanium (GeSn) layer on the second SiGeB layer, the Sn-doped GeSn layer having a tin doping concentration between about 0.1% and about 9%; and epitaxially forming a third SiGeB layer on the Sn-doped GeSn layer.

8. The method of claim 7 further comprising:

before the forming the metal layer on the strained material stack, forming an inter-layer dielectric (ILD) layer over the strained material stack and the substrate;

forming an opening through the ILD layer to expose portions of the strained material stack, the metal layer being formed in the opening of the ILD layer; and forming a conductive contact in the ILD layer to the metal-silicide layer, the conductive contact physically contacting the metal-silicide layer.

9. The method of claim 7, wherein the annealing the metal layer and the strained material stack forming the metal-silicide layer consumes substantially all of the third SiGeB layer in the metal-silicide layer.

10. A method of forming a Fin Field-Effect Transistor (FinFET), the method comprising:

forming a plurality of fins extending from a substrate;

forming a dummy gate structure over the plurality of fins;

forming recesses in the plurality of fins adjacent the dummy gate structure;

epitaxially forming a plurality of strained material stacks in the recesses in the plurality of fins, each of the strained material stacks comprising an epitaxially grown germanium-tin (GeSn) layer and a plurality of epitaxially grown boron-doped (B-doped) silicon-germanium (SiGeB) layers, the epitaxially grown GeSn layer interposed between the plurality of epitaxially grown SiGeB layers;

implanting the strained material stacks with B, indium (In), Sn, or a combination thereof;

forming a metal layer on the strained material stacks;

annealing the metal layer and the strained material stacks to form metal-silicide layers on the strained material stacks, wherein the annealing comprises locally increasing a temperature of the metal layer and the strained material stacks to a higher temperature than a temperature of the substrate, wherein the temperature of the metal layer and the strained material stacks is locally increased by performing a microwave anneal (MWA) process on the metal layer and the strained material stacks; and forming a metal contact to the strained material stacks, the metal contact contacting the metal-silicide layers.

11. The method of claim 10, wherein the temperature of the substrate during the MWA process does not exceed about 600° C. and the temperature of the metal layer and the strained material stacks is between about 1000° C. to about 1100° C.

12. The method of claim 10, wherein the MWA process is a multi-stage MWA process.

13. The method of claim 10, wherein the GeSn layer has a thickness in a range from about 2 nanometers (nm) to about 10 nm.

14. The method of claim 10, wherein the metal layer comprises nickel (Ni), titanium (Ti), cobalt (Co), or a combination thereof, and the metal contact comprises tungsten (W).

15. The method of claim 10, wherein the SiGeB layer is on the GeSn layer and has a Ge concentration in a range from about 50% to about 95%.

16. A method of forming a Fin Field-Effect Transistor (FinFET), the method comprising:

forming a plurality of fins extending from a substrate;

forming a first gate structure over the plurality of fins;

forming recesses in the plurality of fins adjacent the first gate structure;

epitaxially forming a plurality of strained material stacks in the recesses in the plurality of fins, the strained material stacks comprising a plurality of epitaxial layers, the plurality of epitaxial layers including a first epitaxially grown tin-doped (Sn-doped) layer interposed between two or more epitaxially grown boron-doped (B-doped) layers;

co-implanting the strained material stacks with boron (B), indium (In), tin (Sn), antimony (Sb), or a combination thereof, the co-implanting increasing doping concentrations of each of the plurality of epitaxial layers;

depositing a metal layer on the strained material stacks; and heating the metal layer and the strained material stacks to a first temperature while heating the substrate to a second temperature, the first temperature greater than the second temperature, wherein heating the metal layer and the strained material stacks forms metal-silicide layers on the strained material stacks.

17. The method of claim 16, wherein the epitaxially forming the plurality of strained material stacks comprises:

epitaxially forming a first boron-doped (B-doped) silicon-germanium (SiGeB) layer in the recess;

epitaxially forming a second SiGeB layer on the first SiGeB layer, the second SiGeB layer having a higher concentration of germanium than the first SiGeB layer;

epitaxially forming a tin-doped (Sn-doped) germanium (GeSn) layer on the second SiGeB layer, the Sn-doped GeSn layer having a higher concentration of germanium than the second SiGeB layer; and epitaxially forming a third SiGeB layer on the Sn-doped GeSn layer, the third SiGeB layer having a lower concentration of germanium than the Sn-doped GeSn layer.

18. The method of claim 16, wherein the annealing only the metal layer and the strained material stacks comprises locally performing a microwave anneal (MWA) process on the metal layer and the strained material stacks.

19. The method of claim 16, wherein the Sn-doped layer has a concentration of Sn in a range from about 0.1% to about 9%.

20. The method of claim 1, wherein:
the co-implanting comprises providing an implant dose of the second dopants of between about 1E13 atoms/cm$^2$ and about 5E15 atoms/cm$^2$ to the first subset of the at least three sequentially and selectively grown layers, the dopant concentration of the first subset of the at least three sequentially and selectively grown layers being different from a second dopant concentration of a second subset of the at least three sequentially and selectively grown layers after providing the implant dose; and the forming the metal layer on the strained material stack comprises forming the metal layer physically contacting a first layer of the first subset of the at least three sequentially and selectively grown layers.

* * * * *